United States Patent
Goodwin

(10) Patent No.: US 9,618,587 B2
(45) Date of Patent: Apr. 11, 2017

(54) TWO-WIRE HALL-EFFECT SENSOR

(71) Applicant: Ford Global Technologies, LLC, Dearborn, MI (US)

(72) Inventor: William Russell Goodwin, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 13 days.

(21) Appl. No.: 14/800,730

(22) Filed: Jul. 16, 2015

(65) Prior Publication Data

US 2017/0016966 A1    Jan. 19, 2017

(51) Int. Cl.
*G01R 33/06* (2006.01)
*G01R 33/07* (2006.01)
*G01M 13/02* (2006.01)
*G01P 3/44* (2006.01)

(52) U.S. Cl.
CPC ........... *G01R 33/072* (2013.01); *G01M 13/02* (2013.01); *G01P 3/44* (2013.01)

(58) Field of Classification Search
CPC ........ G01D 5/145; G01R 33/07; G01R 33/02; G01R 33/072; G01M 13/02; G01P 3/44
USPC ........................................................ 324/251
See application file for complete search history.

(56) References Cited

U.S. PATENT DOCUMENTS

| | | | |
|---|---|---|---|
| 3,284,703 A | 11/1966 | Brunel | |
| 4,994,731 A | 2/1991 | Sanner | |
| 5,604,433 A | 2/1997 | Theus et al. | |
| 6,501,270 B1 | 12/2002 | Opie | |
| 7,573,112 B2 | 8/2009 | Taylor | |
| 7,719,411 B2 * | 5/2010 | Averitt | H04L 12/40045 324/207.2 |

FOREIGN PATENT DOCUMENTS

CN         203376339 U       1/2014

\* cited by examiner

*Primary Examiner* — Reena Aurora
(74) *Attorney, Agent, or Firm* — James Dottavio; Brooks Kushman P.C.

(57) ABSTRACT

An improved two-wire hall-effect speed sensor circuit includes two separate voltage regulation circuits. The voltage regulator circuits, hall plates, signal processing circuits, and output stage are implemented on an application specific integrated circuit (ASIC). In addition to a supply terminal and a return terminal, the ASIC includes an intermediate terminal. Both voltage regulation circuits may be aided by capacitors, one between the supply terminal and the return terminal, the other between the intermediate terminal and the return terminal. The speed sensor circuit is suitable for use with non-twisted wires, enabling use of a common supply wire for multiple sensors, thus reducing the number of terminals required on the controller and on connectors.

14 Claims, 4 Drawing Sheets

US 9,618,587 B2

TWO-WIRE HALL-EFFECT SENSOR

TECHNICAL FIELD

This disclosure relates to the field of magnetic speed sensors. More particularly, the disclosure pertains to an improved hall-effect sensor circuit for use as a speed sensor in an automotive transmission.

BACKGROUND

Many vehicles are used over a wide range of vehicle speeds, including both forward and reverse movement. Some types of engines, however, are capable of operating efficiently only within a narrow range of speeds. Consequently, transmissions capable of efficiently transmitting power at a variety of speed ratios are frequently employed. When the vehicle is at low speed, the transmission is usually operated at a high speed ratio such that it multiplies the engine torque for improved acceleration. At high vehicle speed, operating the transmission at a low speed ratio permits an engine speed associated with quiet, fuel efficient cruising.

Discrete ratio transmissions are capable of transmitting power via various power flow paths, each associated with a different speed ratio. A particular power flow path is established by engaging particular shift elements, such as clutches or brakes. Shifting from one gear ratio to another involves changing which shift elements are engaged. In automatic discrete ratio transmissions, a controller determines which power flow path should be engaged and establishes the power flow path by controlling the torque capacity of each shift element. The controller typically uses a signal from at least one speed sensor to determine what transmission ratio is suitable for current conditions. During a shift between ratios, the controller typically must measure the progress of the shift in order to determine the desired torque capacity for on-coming and off-going shift elements. Determining the current speed ratio during a shift requires signals from at least two different speed sensors.

FIG. 1 shows a portion of a transmission control system having two speed sensors. Each speed sensor produces a signal from which controller 10 can determine the speed of a particular shaft in the transmission. For example, speed sensor 12 may be associated with the turbine shaft and speed sensor 14 may be associated with the output shaft. A tone wheel is fixed to the shaft. The tone wheel has a number of teeth that pass by a sensing element. A magnetic field is established in the hall sensor such that the magnitude of the magnetic flux is relatively high when a tooth is adjacent to the hall sensing element and relatively low when a gap between teeth is adjacent to the sensing element. Depending on the design of the hall sensor, a single hall element may be used with signal processing based on the hall voltage that is generated by the magnetic field. More often, a group of hall cells is used a difference in voltage between hall cells voltage response is measured and used for improved sensing capability.

Controller 10 interacts with speed sensor 12 via a supply wire 16 and a return wire 18. Controller 10 establishes a voltage difference between the wires. Speed sensor 12 has circuitry such that electrical current on the supply and return wires is varied depending upon the magnetic flux at the sensing element. Commonly, the signal is binary such that the current is at a low level when the magnetic flux is less than a threshold and is at a high level when the magnetic flux exceeds the threshold. By noting the amount of time that passes between current level changes, the controller can calculate the speed and, in some cases, the direction of the shaft. Similarly, controller 10 interacts with speed sensor 14 via a supply wire 20 and a return wire 22 to determine the speed of a second shaft. Various types of electromagnetic interference act upon the wires between the controller and the speeds sensors, which may cause the voltage supplied at the speed sensor end of a wire to differ from the voltage at the controller end of the same wire. However, by twisting corresponding supply and return wires over the majority of the their length, the interference sources effect each wire almost equally such that the voltage difference between them remains close to constant along their length.

FIG. 2 schematically illustrates a sensor circuit suitable for either speed sensor 12 or 14 of FIG. 1. The majority of the circuitry is implemented using Application Specific Integrated Circuit (ASIC) 24. ASIC 24 has a supply terminal 26 to which the supply wire is connected and a return terminal 28 to which the return wire is connected. The sensing element is a collection of one or more hall plates 30 placed within the magnetic field to be sensed. Electrical current is passed through each hall plate from 32 to 34. The magnitude of the electrical current is determined by the voltage difference. The hall plates produce a voltage at output port 36 that depends upon the magnetic flux and upon the magnitude of the electrical current. Since the objective is to measure the flux, it is important to carefully control the current by carefully controlling the voltage across the hall plates. Although twisting the wires helps limit voltage fluctuations due to interference, additional voltage regulation at the sensor may be utilized for consistency of operation. In a typical implementation, a capacitor 38 may be placed between the supply terminal 26 and the return terminal 28. This capacitor is used to smooth voltage fluctuations and to protect the ASIC from abnormal voltage spikes. Capacitor 38 is external to ASIC 24 in order to facilitate changing the capacitance for different applications and because large capacitors are typically impractical to implement on the silicon substrate. A voltage regulator circuit 40 dynamically controls the supply voltage needed to operate the Hall plates and the signal processing circuit. This voltage level is the difference between the electrical potential be 32 and return terminal 28. Signal processing circuitry 42 creates a voltage output on connection 44 which then operates the output stage 46. Specifically, for a binary sensor, the sensor draws a continuous current that is function of the operation of the voltage regulator, signal processing block and the current used to operate the hall plates. The output stage then draws an additional current of some amount when actuated to provide a change in current draw which is substantially higher than the variability in the other sources of current such that controller 10 can easily distinguish real signal changes from noise.

SUMMARY OF THE DISCLOSURE

A two-wire hall-effect speed sensor, according to one embodiment, includes a supply terminal, a return terminal, an intermediate terminal, first and second voltage regulation circuits, a hall plate, and signal processing and output stage circuits. The first voltage regulation circuit regulates a voltage difference between the intermediate terminal and the return terminal. The hall plate has a supply port, a return port connected to the return terminal, and an output port. The voltage of the output port responds to a magnetic field. The second voltage regulation circuit regulates a voltage difference between the hall plate supply port and the return terminal. The signal processing and output stage circuits vary an electric current from the supply terminal to the return terminal in response to changes in the voltage at the hall plate output port. For example, the set the current to a first level when the hall plate output voltage exceeds a threshold and to a different value when the hall plate voltage is less than the threshold. The speed sensor may also include a capacitor and/or Zener diode connected across the intermediate terminal and the return terminal to assist the first voltage regulator in maintaining a target voltage. The speed sensor may include a capacitor across the supply terminal and the return terminal.

A hall-effect sensor, according to another embodiment, includes a hall effect integrated circuit having supply intermediate and return terminal, a capacitor connected across the supply and return terminals, and another capacity connected across the intermediate and return terminals. The speed sensor may also include a Zener diode connected across the intermediate and return terminals.

A transmission includes a controller and two hall-effect integrated circuits, each having supply, return, and intermediate terminals. Capacitors are connected across the intermediate and return terminals of each of the hall-effect integrated circuits. The supply terminals of each hall-effect integrated circuit are connected to a common supply terminal of the controller. The return terminals of each hall-effect integrated circuit are connected to separate speed sensor terminals of the controller. Capacitors may also be connected across the supply and return terminals of one or both hall-effect integrated circuits. Zener diodes may be connected across the intermediate and return terminals of one or both hall-effect integrated circuits. Each of the hall-effect integrated circuits may be configured to respond to the position of tone wheels fixed to an input shaft, an output shaft, or an intermediate shaft.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
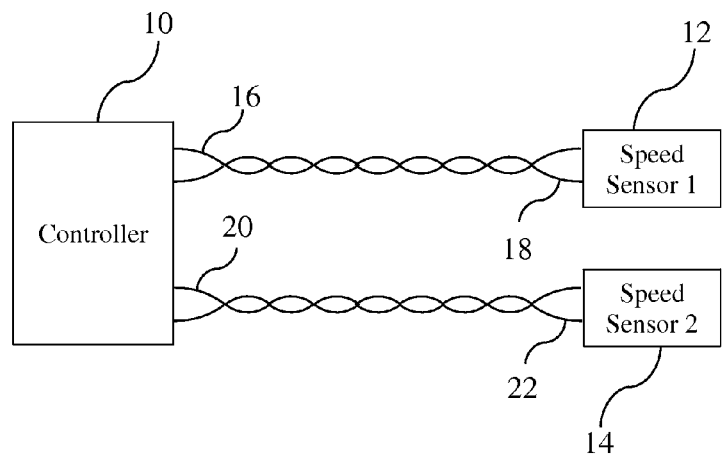
FIG. 1 is a first transmission speed sensor circuit utilizing twisted wire pairs.

In order to improve fuel economy and performance, the number of different speed ratios in discrete ratio transmissions has been increasing. As a result, it is more common to schedule direct multiple-step shifts. Frequently, such shifts may involve multiple off-going shift elements and multiple on-coming shift elements. During such a shift, it is desirable to determine the slip speed across each shift element. Due to the increased number of degrees of freedom, information about the speed of the output and the input is not sufficient to calculate all of these slip speeds. Therefore, it is advantageous to install additional speed sensors that permit the controller to determine the speed of shafts other than the input shaft and the output shaft. Which additional shaft speed must be measured varies among potential shifts, so several additional speed sensors must be installed. Using twisted pair wiring as shown in FIG. 1 requires 2*N controller terminals for N speed sensors. Also, any connectors between the outside of the transmission case and the inside of the transmission case must provide 2*N connections.

Figure 2:
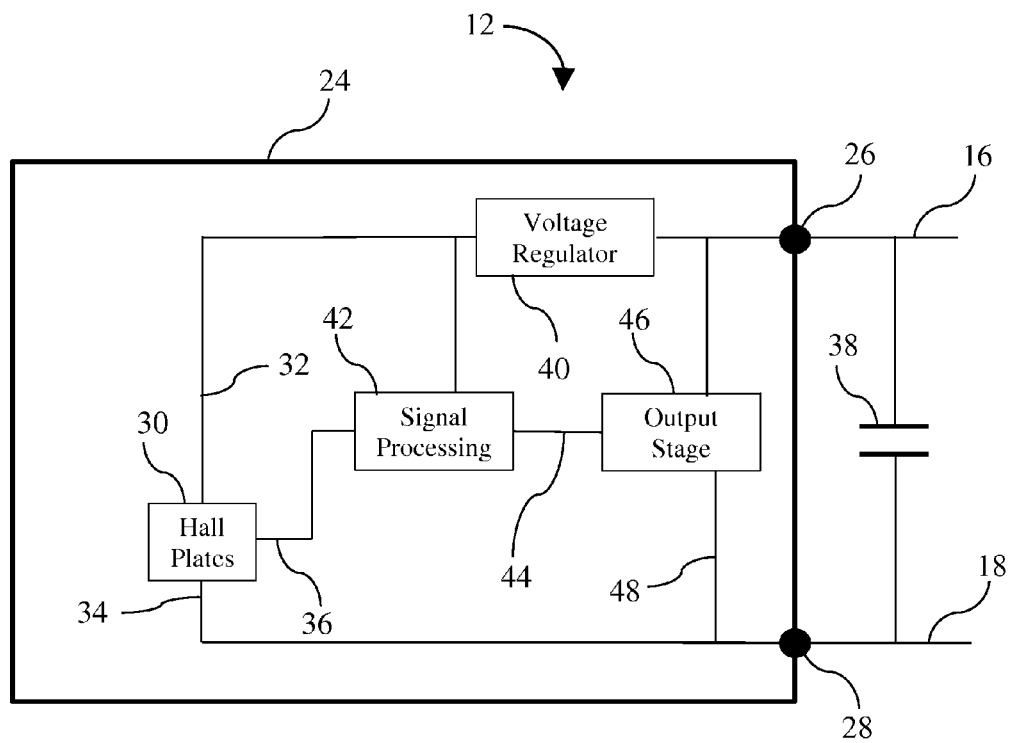
FIG. 2 is a first hall-effect sensor circuit suitable for use in the transmission speed sensor circuit of FIG. 1.
Figure 3:
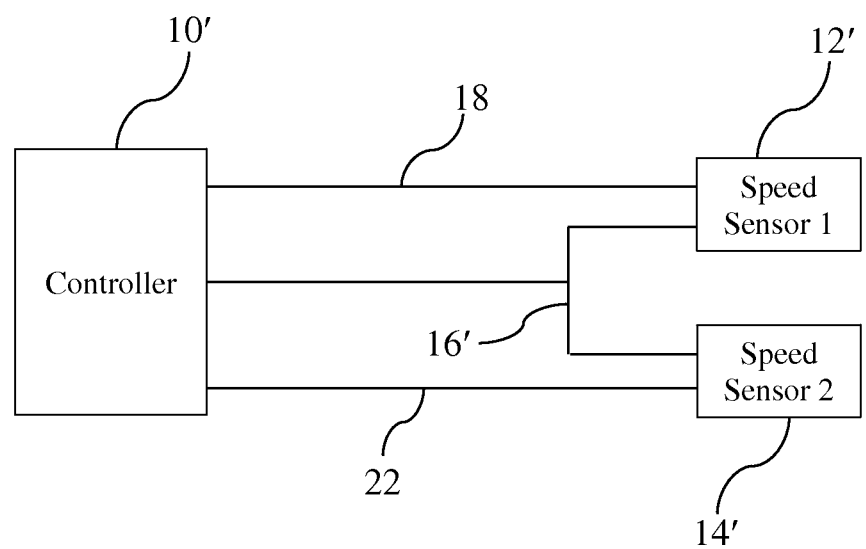
FIG. 3 is a second transmission speed sensor circuit utilizing a common supply terminal on the controller.

FIG. 3 shows a portion of a transmission control system with two speed sensors. Like the speed sensors of FIG. 1, speed sensors 12' and 14' produce electrical currents that vary based passage of tone wheels that produce varying magnetic fields. However, in the arrangement of FIG. 3, the supply terminals of both speed sensors are connected to a single supply wire 16' from controller 10'. This reduces the number of pins needed on the controller and reduces the number of pins needed on connectors between the exterior and interior of the transmission case. Specifically, for N speed sensors, N+1 pins are needed. The controller determines the speed of the shaft associated with sensor 12' based on measurement of the current in return wire 18 and determines the speed of the shaft associated with sensor 14' based on measurement of the current in return wire 22. Alternatively, a common return wire could be used and the controller could measure the current in separate supply wires. Because it is not practical to twist the wires as in FIG. 1, various sources of interference may impact the voltage difference between the supply terminal and the return terminal of a sensor even if the voltage difference is set correctly at the controller terminals. Consequently, it may be necessary to make the sensor circuit more robust than the circuit of FIG. 2.

Figure 4:
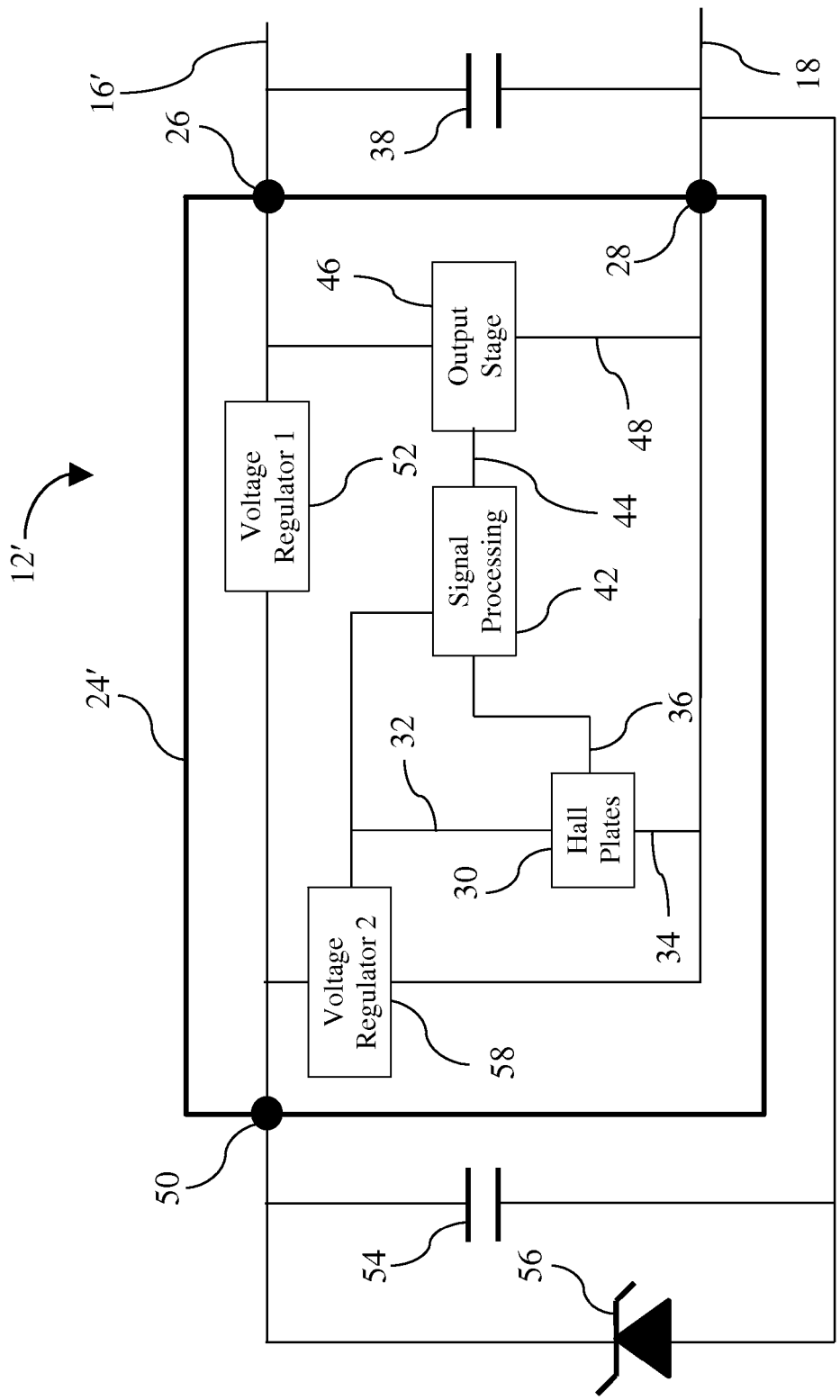
FIG. 4 is a second hall-effect sensor circuit suitable for use in the transmission speed sensor circuit of FIG. 3.
Figure 5:
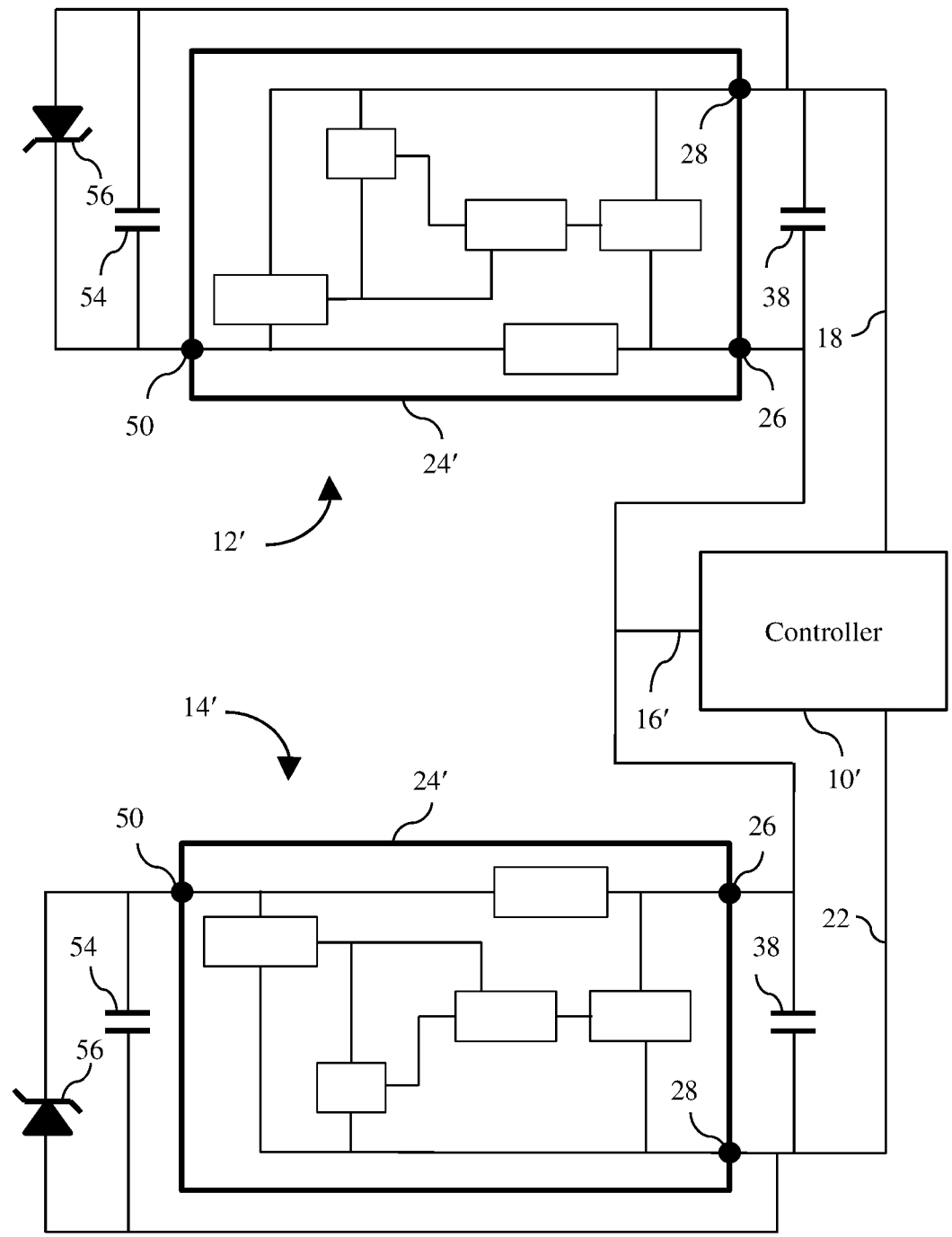
FIG. 5 is the second transmission speed sensor circuit of FIG. 3 using the second hall-effect sensor circuits of FIG. 4.

FIG. 4 schematically illustrates a sensor circuit suitable for either speed sensor 12' or 14' of FIG. 3. Components that are unchanged from the sensor circuit of FIG. 2 use the same reference number. Components that are analogous but slightly modified use the same reference number with a prime ('). Increasing the capacitance of capacitor 38 would help to minimize voltage fluctuations between supply terminal 26 and return terminal 28. However, capacitance at 38 tends to delay the response of the current in wire 18 following a transition in output stage 46. The controller recognizes the transition when the current in wire 18 passes a threshold. If the delay is excessive, the current may not reach the threshold before the next transition, so the controller would not recognize the transition. In addition to supply terminal 26 and return terminal 28, Hall-effect Integrated Circuit (HEIC) 24' has an intermediate terminal 50. Voltage regulator circuit 52 dynamically controls the voltage difference between intermediate terminal 50 and return terminal 28 to a predetermined fixed value less than the voltage difference between the supply terminal 26 and the return terminal 28. Capacitor 54 and Zener diode 56, both of which may be physically separate from HEIC 24' assist voltage regulator circuit 52 in maintaining this voltage at the desired value. As discussed above, capacitor 54 prevents the voltage from changing quickly. Because voltage regulator 52 isolates capacitor 54 from output stage transitions, capacitor 54 may have a substantially higher capacitance than capacitor 38 without creating excessive delay in the current response. Zener diode 56 blocks current flow until the voltage difference reaches a characteristic level and permits current flow when the voltage difference is higher than the characteristic level. This prevents the voltage difference from exceeding the characteristic level. Capacitor 54 and Zener diode 56 may be used separately or in combination. A second voltage regulator circuit 58 dynamically controls the voltage difference between hall plate supply port 32 and return terminal 28 to a predetermined fixed value less than the voltage difference between intermediate terminal 50 and return terminal 28. This two-stage voltage regulation provides a sufficiently constant current through the hall plates and to signal processing circuitry 42 in the presence of substantially more severe interference than possible with the sensor circuit of FIG. 2. FIG. 5 illustrates the result of using two of the hall-effect sensor circuits of FIG. 4 in the speed sensor circuit of FIG. 3.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. As such, embodiments described as less desirable than other embodiments or prior art implementations with respect to one or more characteristics are not outside the scope of the disclosure and can be desirable for particular applications.

What is claimed is:

1. A two-wire hall-effect sensor comprising:
   a supply terminal;
   a return terminal;
   an intermediate terminal;
   a first voltage regulation circuit configured to regulate a voltage difference between the intermediate terminal and the return terminal to a first predetermined value when a voltage difference between the supply terminal and the return terminal exceeds the first predetermined value;
   a hall plate having a supply port, a return port electrically connected to the return terminal, and an output port;
   a second voltage regulation circuit configured to regulate a voltage difference between the hall plate supply port and the return terminal to a second predetermined value when a voltage difference between the intermediate terminal and the return terminal exceeds the second predetermined value; and
   signal processing and output stage circuits configured to vary an electrical current from the supply terminal to the return terminal in response to changes in the voltage difference between the hall plate output port and the return terminal.

2. The sensor of claim 1 further comprising a first capacitor connected across the intermediate terminal and the return terminal.

3. The sensor of claim 2 further comprising a Zener diode connected across the intermediate terminal and the return terminal.

4. The sensor of claim 2 further comprising a second capacitor connected across the supply terminal and the return terminal.

5. The sensor of claim 1 further comprising a Zener diode connected across the intermediate terminal and the return terminal.

6. The sensor of claim 1 wherein the signal processing and output stage circuits set the electrical current to a first level in response to the voltage difference between the hall plate output port and the return terminal exceeding a threshold and set the electrical current to a second level in response the voltage difference between the hall plate output port and the return terminal being less than the threshold.

7. A hall-effect sensor comprising:
   a hall-effect integrated circuit having supply, intermediate, and return terminals and configured to provide two stages of voltage regulation;
   a first capacitor connected across the supply and return terminals to buffer a voltage there-across from electromagnetic interference acting on non-twisted wires connecting the supply and return terminals to a controller; and
   a second capacitor connected across the intermediate and return terminals to buffer a voltage there-across.

8. The hall-effect sensor of claim 7 further comprising a Zener diode connected across the intermediate and return terminals to further buffer the voltage there-across.

9. The sensor of claim 7 wherein the integrated circuit comprises:
   a first voltage regulation circuit configured to regulate a voltage difference between the intermediate terminal and the return terminal to a first predetermined value when a voltage difference between the supply terminal and the return terminal exceeds the first predetermined value;
   a hall plate having a supply port, a return port electrically connected to the return terminal, and an output port;
   a second voltage regulation circuit configured to regulate a voltage difference between the hall plate supply port and the return terminal to a second predetermined value when a voltage difference between the intermediate terminal and the return terminal exceeds the second predetermined value; and
   signal processing and output stage circuits configured to vary an electrical current from the supply terminal to the return terminal in response to changes in the voltage difference between the hall plate output port and the return terminal.

10. A transmission comprising:
   first and second hall-effect integrated circuits (HEICs) each having supply, return, and intermediate terminals;
   first and second capacitors connected across the intermediate and return terminals of the first and second HEICs respectively; and
   a controller having a common supply terminal connected to the supply terminals of both the first and second HEICs and having first and second speed sensor terminals connected to the return terminals of the first and second HEICs respectively.

11. The transmission of claim 10 further comprising a third capacitor connected across the supply and return terminals of the first HEIC.

12. The transmission of claim 11 further comprising a fourth capacitor connected across the supply and return terminals of the second HEIC.

13. The transmission of claim 10 further comprising a first Zener diode connected across the intermediate and return terminals of the first HEIC.

14. The transmission of claim 13 further comprising a second Zener diode connected across the intermediate and return terminal of the second HEIC.

\* \* \* \* \*